(12) United States Patent
Wang et al.

(10) Patent No.: US 11,134,590 B2
(45) Date of Patent: Sep. 28, 2021

(54) AUTOMOTIVE POWER INVERTER WITH COOLING CHANNELS AND COOLING PINS

(71) Applicant: Ford Global Technologies, LLC, Dearborn, MI (US)

(72) Inventors: Fan Wang, Novi, MI (US); Lihua Chen, Farmington Hills, MI (US); Serdar Hakki Yonak, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/741,096

(22) Filed: Jan. 13, 2020

(65) Prior Publication Data
US 2021/0219465 A1 Jul. 15, 2021

(51) Int. Cl.
*H05K 7/20* (2006.01)
*H05K 5/00* (2006.01)
*H05K 5/03* (2006.01)
*H05K 5/02* (2006.01)

(52) U.S. Cl.
CPC ....... *H05K 7/20872* (2013.01); *H05K 5/0021* (2013.01); *H05K 5/0247* (2013.01); *H05K 5/03* (2013.01); *H05K 7/209* (2013.01); *H05K 7/20854* (2013.01); *H05K 7/20927* (2013.01)

(58) Field of Classification Search
CPC .......... H05K 7/20254; H05K 7/20872; H05K 7/20927; H05K 5/0021; H05K 5/0247; H05K 5/03; H05K 7/20854; H05K 7/209; H05K 7/1432; H05K 7/20327; H01L 23/36–4735; H01L 23/473; H01L 25/117; H01L 23/367; H01L 25/115; H02M 7/537; B01D 2313/38; B01D 63/082; F28D 9/0037; F28F 2260/02; F28F 3/12
See application file for complete search history.

(56) References Cited

U.S. PATENT DOCUMENTS

| | | | | |
|---|---|---|---|---|
| 5,978,220 A | * | 11/1999 | Frey | H01L 23/473 361/699 |
| 7,173,823 B1 | * | 2/2007 | Rinehart | F28D 9/0031 165/80.4 |
| 8,081,465 B2 | * | 12/2011 | Nishiura | H05K 7/20927 361/703 |
| 9,003,649 B1 | * | 4/2015 | Romero | F28F 3/022 29/830 |
| 10,405,466 B1 | * | 9/2019 | Pradeepkumar | B60L 50/50 |
| 10,822,096 B2 | * | 11/2020 | Yang | H05K 7/20254 |
| 2003/0132040 A1 | | 7/2003 | Radosevich | |

(Continued)

*Primary Examiner* — Stephen S Sul
*Assistant Examiner* — Michael A Matey
(74) *Attorney, Agent, or Firm* — David B. Kelley; Brooks Kushman P.C.

(57) ABSTRACT

An automotive power module has a plurality of power cards stacked to form an inverter module, and a DC-link capacitor mounted against the inverter module. Each of the power cards includes a top cover having opposite sides. One of the sides has extended therefrom a first matrix of pins. Each of the power cards also includes a plurality of integrated circuits defining transistors of an inverter mounted on the other of the sides, terminals extending from a perimeter of the top cover and in electrical communication with the integrated circuits, and a bottom cover having extended therefrom a second matrix of pins.

12 Claims, 4 Drawing Sheets

(56) References Cited

U.S. PATENT DOCUMENTS

| | | | |
|---|---|---|---|
| 2008/0239663 A1 | 10/2008 | Yamamoto et al. | |
| 2012/0212907 A1* | 8/2012 | Dede | H01L 23/4735 361/702 |
| 2014/0158324 A1* | 6/2014 | Tochiyama | H01L 23/473 165/67 |
| 2015/0021756 A1 | 1/2015 | Adachi | |
| 2015/0348869 A1* | 12/2015 | Joshi | H01L 25/07 361/700 |
| 2016/0308481 A1* | 10/2016 | Lei | B60L 50/60 |
| 2016/0309614 A1* | 10/2016 | Kikuchi | H05K 7/20927 |
| 2016/0309623 A1* | 10/2016 | Lei | H05K 7/20254 |
| 2017/0055378 A1* | 2/2017 | Zhou | H05K 7/20927 |
| 2017/0259672 A1* | 9/2017 | Lei | B60L 50/16 |
| 2017/0363375 A1* | 12/2017 | Mayor | F28F 9/22 |
| 2018/0063989 A1* | 3/2018 | Lei | H05K 7/20272 |
| 2018/0077818 A1* | 3/2018 | Harkins | H05K 7/2089 |
| 2019/0335627 A1* | 10/2019 | Fang | H05K 7/20927 |
| 2019/0366823 A1* | 12/2019 | Pradeepkumar | B60K 1/04 |
| 2020/0006197 A1* | 1/2020 | Hart | H01L 23/44 |
| 2020/0100388 A1* | 3/2020 | Hernandez-Toledo | H05K 7/20636 |

\* cited by examiner

Fig-5B

AUTOMOTIVE POWER INVERTER WITH COOLING CHANNELS AND COOLING PINS

TECHNICAL FIELD

This disclosure relates to the cooling of automotive power electronics components.

BACKGROUND

An electric or hybrid vehicle may contain one or more motors for propulsion. The vehicle may also contain a high-voltage traction battery as a source of energy for the motor(s), and a generator to charge the traction battery, etc. As the motor(s), traction battery, and generator may require varying electrical parameters, electrical communication between the devices may require modification of the power provided or consumed by the devices. Such modification may generate heat.

SUMMARY

An automotive power module has a plurality of power cards stacked to form an inverter module, and a DC-link capacitor mounted against the inverter module. Each of the power cards includes a top cover having opposite sides. One of the sides has extended therefrom a first matrix of pins that has a first portion at a first density and a second portion at a second density. The first density is greater than the second density. Each of the power cards also includes a plurality of integrated circuits defining transistors of an inverter mounted on the other of the sides. Some of the integrated circuits are configured to generate more heat than other of the integrated circuits during operation of the inverter. The first portion is directly opposite the some of the integrated circuits. The second portion is directly opposite the other of the integrated circuits. The first matrix of pins is in thermal communication with the integrated circuits. Each of the power cards further includes terminals extending from a perimeter of the top cover and in electrical communication with the integrated circuits, and a bottom cover having extended therefrom a second matrix of pins. The bottom cover is configured to seal against the one of the sides of the top cover such that the top and bottom covers define a cooling channel having an inlet and outlet, the first and second matrices intermesh, ends of the pins of the first matrix contact the cover, ends of the pins of the second matrix contact the top cover to be in thermal communication with the integrated circuits, and coolant flowing through the channel flows through the first and second matrices to remove heat captured by the first and second matrices from the integrated circuits.

An automotive power module has a plurality of power cards stacked to form an inverter module, and a DC-link capacitor mounted against the inverter module. Each of the power cards includes a baseplate having opposite sides. One of the sides has extended therefrom a first matrix of pins. Some of the pins of the first matrix are composed of a first material having a first thermal conductivity. Other of the pins of the first matrix are composed of a second material having a second thermal conductivity. The first conductivity is greater than the second conductivity. Each of the power cards also includes a plurality of integrated circuits defining transistors of an inverter mounted on the other of the sides. Some of the integrated circuits are configured to generate more heat than other of the integrated circuits during operation of the inverter. The some of the pins of the first matrix are directly opposite the some of the integrated circuits. The other of the pins of the second matrix are directly opposite the other of the integrated circuits. The first matrix of pins is in thermal communication with the integrated circuits. Each of the power cards further includes terminals extending from a perimeter of the baseplate and in electrical communication with the integrated circuits, and a cover having extended therefrom a second matrix of pins. The cover is configured to seal against the one of the sides of the baseplate such that the cover and baseplate define a cooling channel having an inlet and outlet, the first and second matrices intermesh, ends of the pins of the first matrix contact the cover, ends of the pins of the second matrix contact the baseplate to be in thermal communication with the integrated circuits, and coolant flowing through the channel flows through the first and second matrices to remove heat captured by the first and second matrices from the integrated circuits.

An automotive power module has a plurality of power cards stacked to form an inverter module, and a DC-link capacitor mounted against the inverter module. Each of the power cards includes a baseplate having opposite sides. One of the sides has extended therefrom a first matrix of pins arranged to have a first portion with a first density and a second portion with a second density. Some of the pins of the first and second portions composed of a first material, and other of the pins of the first and second portions composed of a second material having a thermal conductivity different than the first material. Each of the power cards also includes a plurality of integrated circuits defining transistors of an inverter mounted on the other of the sides. Some of the integrated circuits are configured to generate more heat than other of the integrated circuits during operation of the inverter. The first matrix is directly opposite and in thermal communication with the integrated circuits. Each of the power cards further includes terminals extending from a perimeter of the baseplate and in electrical communication with the integrated circuits, and a cover on one of the sides having extended therefrom a second matrix of pins. The cover is configured to seal against the one of the sides of the baseplate such that the cover and baseplate define a cooling channel having an inlet and outlet, the first and second matrices intermesh, ends of the pins of the first matrix contact the cover, and ends of the pins of the second matrix contact the baseplate to be in thermal communication with the integrated circuits. Coolant flowing through the channel flows through the first and second matrices to remove heat from the integrated circuits.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

An inverter system controller is an apparatus used to modify power between power generating and consuming devices. The inverter system controller may contain a 3-phase inverter. The inverter may be used to convert DC electrical power from a traction battery into AC electrical power usable by a motor. In alternate embodiments, the inverter system controller may contain a 3-phase rectifier. The rectifier may be used to convert AC electrical power from a generator to DC electrical power, which may charge a traction battery. Some embodiments may contain both a 3-phase inverter, and a 3-phase rectifier, in which a traction battery may be used to provide electrical power to a motor through the inverter, and a generator may be used to charge a battery through the rectifier.

An inverter system controller may contain a baseplate, a power card, and a DC-link capacitor. In some embodiments, a voltage converter may be comprised of the power card and DC-link capacitor. In other embodiments, the power card and DC-link capacitor may be stand-alone systems. The power card and capacitor may be in electrical communication through an electrical bus network. As the power card and capacitor may be used to modify electrical parameters, including high voltage, the power card and capacitor may generate heat. Appropriate cooling and spatial isolation may be used to reduce neighboring effects of generated heat. Still, the power card and capacitor may produce less DC inductance if closer in proximity to each other.

An embodiment of the inverter system controller that allows for closer spatial relation between the power card and the capacitor includes a baseplate, a power card, and a capacitor.

A baseplate may be used to support the power card and the capacitor. In some embodiments, the baseplate contains a surface capable of supporting a plurality of power cards and capacitors. In embodiments containing a plurality of power cards, the power cards may be stacked, wherein a power card may be in physical contact with an adjacent power card.

The baseplate may contain a plurality of manifolds for the distribution of coolant. For example, a baseplate may have an inlet manifold to provide coolant to a dependent device, and a baseplate may have an outlet manifold to remove coolant from a dependent device.

A DC-link capacitor may be disposed on the baseplate. The capacitor may be stacked with a power card, wherein the capacitor is in physical contact with an adjacent power card.

A power card may contain a cooling plate, a top cover, a bottom cover, and a plurality of terminals. The power card may be used to provide thermal communication between an integrated circuit disposed on or housed within the power card, coolant flowing through the power card, and other components of the power card. This thermal communication may transfer heat from an integrated circuit to the coolant. Thermal communication may also be used to regulate temperatures of integrated circuits or components of the power card to optimal thermal operating ranges.

A cooling plate may be used to provide thermal regulation to an integrated circuit. In some embodiments, the cooling plate may be used to provide thermal regulation to a plurality of integrated circuits. The cooling plate may have a mount to secure the integrated circuit. In other embodiments, the mount may be partially disposed in the cooling plate. The mount may be in thermal communication with coolant. In some embodiment, the top or bottom cover may be used to mount and secure the integrated circuit. In some embodiments, the cooling plate may be integral with the top and bottom cover.

A section of the cooling plate may be composed of an insulating material. This embodiment of the power card acts to prevent or mitigate unwanted thermal communication with the coolant, top and bottom covers, cooling channel, baseplate, pins, integrated circuits, or other heat conducting elements. In other embodiments, a section of the cooling plate may be composed of a thermal conducting material. Such embodiments may allow the cooling plate to be in thermal communication with an adjacent power card.

A plurality of covers may be used to further provide thermal regulation to an integrated circuit. In some embodiments, the cover may be used to provide thermal regulation to a plurality of integrated circuits. The covers may have a mount to secure the integrated circuit. In other embodiments, the mount may be partially disposed in the cover.

The covers may be composed of an insulating material. This embodiment of the cover acts to prevent or mitigate unwanted thermal communication with the coolant, cooling channel, other of the covers, pins, integrated circuits, or other heat conducting elements. In other embodiments, the cover may be composed of a thermal conducting material. Such embodiments may allow the cover to be in thermal communication with an adjacent power card.

The cooling plate and covers may cooperate to form a cooling channel within the power card. In other embodiments, the channel may be fully disposed within the cooling plate and the cover. The cooling plate and cover may further cooperate to form an inlet and outlet, providing access to the cooling channel. The inlet and outlet may be substantially parallel.

The power card may be disposed on the baseplate. The inlet of the power card may cooperate with the inlet manifold of the baseplate and the outlet of the power card may cooperate with the outlet manifold of the baseplate, wherein both combinations provide fluid access between the manifolds of the baseplate and the cooling channel of the power card.

The cooling channel may contain a heat spreader and pin fins (pins). The heat spreader may be used to achieve thermal communication at an even rate. This heat spreader may be placed in a symmetrical manner, dividing and defining the cooling channel into two generally even pathways. The pathways may be substantially parallel to each other. These pathways may also be substantially perpendicular to one of the inlet and outlet. The heat spreader may be composed of a material suitable to conduct heat. This material may be copper or another metal generally capable of conducting heat. The heat spreader may be composed of multiple materials, and the materials may conduct heat at different rates. Alternatively, the heat spreader may be composed of materials not suitable to conduct heat. This may be used to place sections of the heat spreader in areas of the cooling channel that are not adjacent to integrated circuits.

In an alternate embodiment, the heat spreader may divide the cooling channel into uneven sections. In another alternate embodiment, the heat spreader may not divide the cooling channel. Instead, the heat spreader block may be disposed within the cooling channel, yet not completely segment the cooling channel. The heat spreader may protrude into the cooling channel. Alternatively, the heat spreader may define a section of the wall in the baseplate or cover that defines the cooling channel. Multiple heat spreaders may be used in the cooling channel. For example, in a power module containing multiple sections of integrated circuits, heat spreaders may be used in sections adjacent to integrated circuits, while heat spreaders may not be used in sections not adjacent to integrated circuits.

The pins may be used to improve transferring thermal communication between the integrated circuits and the coolant. The pins may be in thermal communication with the integrated circuits, the cooling channel, the coolant, the cooling plate, or the cover. The pins may be disposed on one of the cooling plate and the cover. The pins may be generally cylindrical or may be tapered. The pins may have a cross-section of one of a circle, elliptical, teardrop, etc.

Pins that have a circular cross section may allow an advantageous surface area to volume ratio. The pins may be arranged into a matrix. Some embodiments of the power card may have pins arranged into multiple matrices. The matrix may have a pattern and a density. The pattern and density of the matrix may be independent from each other. For example, a pattern may be that for the distance between six pins in a first direction, is a count of two pins in a perpendicular direction of the same distance. If the distance in the example was set to one centimeter, the density of pins would be equal to twelve pins per square centimeter. However, if the distance was set to two centimeters, the density would be three pins per square centimeter. Similarly, a density of twelve pins per square centimeter can be obtained by a pattern of six pins by two pins per square centimeter.

The matrix may contain a plurality of patterns of pins. For example, a matrix may contain a first pattern of 1×1, and a second pattern of 2×3. Some embodiments of the power card may contain multiple matrices. For example, a power card may contain a first matrix disposed on the coolant plate, and a second matrix disposed on the cover. In these embodiments, a first matrix may be cooperable with the second matrix upon combining the coolant plate with the cover, wherein the matrices intermesh with one another. Some embodiments may contain three patterns of pins, wherein one of the patterns is capable of intermeshing with the other two. For example, a power card may have a first matrix disposed on the coolant plate having a first and second pattern, and a second matrix disposed on the cover having a third pattern, wherein the first and second pattern are distinct from one another, yet the third pattern is capable of intermeshing with both the first and second patterns.

During the combination of the cooling plate and the cover, the pins of the first matrix may extend from the cooling plate, through the cooling channel, and may physically contact the cover. Likewise, the pins of the second matrix may extend from the cover, through the coolant channel, and may physically contact the cooling plate. The cooling pins may be integrally connected to one of the cooling plate and cover.

The pins may be composed of varying materials. For example, some of the pins may be composed of thermal conducting materials, while other of the pins may be composed of thermal insulating materials. In a further example, some of the pins may be composed of a thermal conducting material that has a higher rate of thermal communication than other pins composed of a thermal conducting material. The pins may be configured according to a thermal strategy to optimize thermal communication.

The plurality of terminals may be disposed on one of the cooling plate and the cover. The plurality of terminals may extend from the perimeter of the power card. One of the terminals in the plurality of terminals may be in electrical communication with an integrated circuit housed in the power card.

A first thermal strategy may be a pattern strategy. The pattern strategy may use the difference in effect that a first pattern of pins may have on thermal communication, in comparison to the effect that a second pattern of pins may have on thermal communication. For example, a power card may include a matrix of pins having a first and second pattern of pins. The first pattern may be better at facilitating thermal communication as opposed to the second pattern. The power card may be capable of housing a high-power integrated circuit and a low-power integrated circuit, wherein the high-power integrated circuit produces more heat than the low-power integrated circuit. The power card may be designed to have the first pattern of the matrix disposed on a surface in thermal communication with the high-power integrated circuit, and the second pattern of the matrix disposed on a surface in thermal communication with the low-power integrated circuit. This strategy may allow for even distribution of thermal communication.

A second thermal strategy may be a density strategy. The density strategy may use the difference in effect that a first density may have on thermal communication, in comparison to the effect that a second density of pins may have on thermal communication. For example, a power card may include a matrix of pins having a first density and a second density. The first density may be better at facilitating thermal communication as opposed to the second density. The power card may be capable of housing a high-power integrated circuit and a low-power integrated circuit, wherein the high-power integrated circuit produces more excess heat than the low-power integrated circuit. The power card may be designed to have the first density disposed on a surface in thermal communication with the high-power integrated circuit, and the second density disposed on a surface in thermal communication with the low-power integrated circuit. This strategy may allow for even distribution of thermal communication.

Some embodiments using the density strategy may gradually increase the density of pins along a path in the cooling channel. The gradual increase may be a linear function. For example, the density may follow a formula such as $f(x)=x+c$, wherein x is distance away the from the inlet, c is the control for the starting point of pins, and $f(x)$ is the density of pins at that point. Other embodiments may use exponential ($f(x)=x^y+c$), logarithmic ($f(x)=\log y(x)+c$), or other continuous functions. Alternatively, the gradual increase may be a non-continuous/piece-wise function.

A third thermal strategy may be a material strategy. The material strategy may use the difference in effect that a pin composed of a first material may have on thermal communication, in comparison to the effect that a pin composed of a second material may have on thermal communication. For example, a power card may include a matrix of pins wherein some of the pins are composed of a first material, and other of the pins are composed of a second material. The first material may be better at facilitating thermal communication as opposed to the second material. The power card may be capable of housing a high-power integrated circuit and a low-power integrated circuit, wherein the high-power integrated circuit produces more heat than the low-power integrated circuit. The power card may be designed to have the pins composed of the first material disposed on a surface in thermal communication with the high-power integrated circuit, and the pins composed of the second material disposed on a surface in thermal communication with the low-power integrated circuit. This strategy may allow for even distribution of thermal communication.

A fourth thermal strategy may be a combination of at least two of the pattern, density, and material strategies. The combination strategy may use at least two of the pattern, density, and material strategies to improve even distribution of thermal communication throughout a power card. For example, a power card may include a matrix of pins having a first and second pattern, a first and second density, and composed of a first material and a second material, wherein the first pattern, first density, and first material are better at facilitating thermal communication as opposed to the second pattern, second density, and second material respectively. The power card may be capable of housing a high-power integrated circuit and a low-power integrated circuit, wherein the high-power integrated circuit produces more excess heat than the low-power integrated circuit. The power card may be designed to have pins composed of a combination of the first pattern, first density, and first material disposed on a surface in thermal communication with the high-power integrated circuit, and pins composed of a combination of the second pattern, second density, and second material disposed on a surface in thermal communication with the low-power integrated circuit. This strategy may allow for even thermal communication.

Figure 1A:
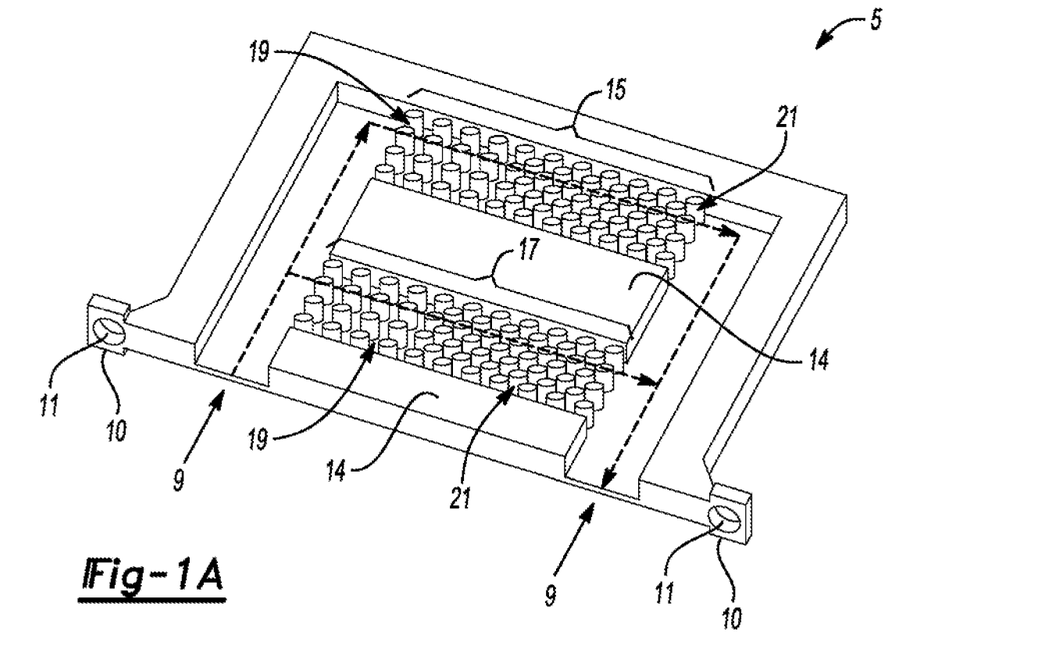
FIGS. 1A and 1B are perspective views of a cover without and with a substrate and circuit mounts, and terminals respectively.
Figure 1B:
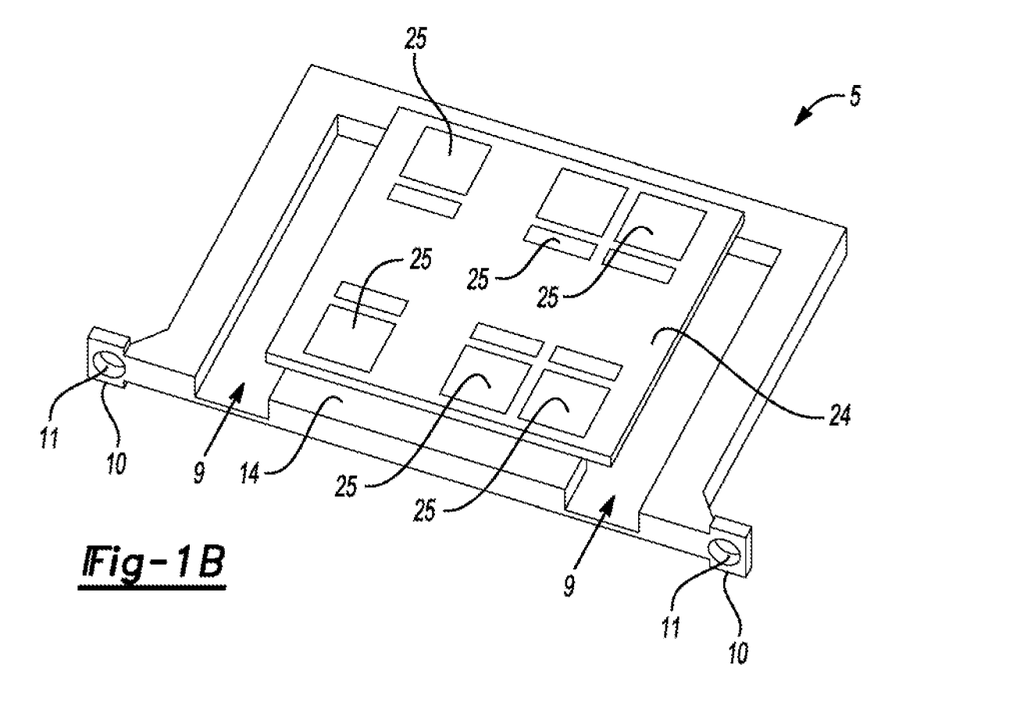

FIGS. 1A and 1B show an embodiment of a bottom cover 5. The depicted embodiment contains a portion of a cooling channel 9, and mounting tabs 10 that define through holes 11. A first matrix of pin fins 15 is disposed within the portion of the cooling channel 9. The first matrix 15 defines a first section 19 of lower density, and a second section 21 of higher density. Alternatively, the first section 19 may be comprised of a different pattern of pins than the second section 21. The first matrix 15 is disposed within the channel 9 such that the section 19 engages flowing coolant (indicated by dashed arrow line) before the second section 21. A second matrix of pin fins 17 is disposed within the portion of the cooling channel 9. It similarly defines the first section 19 of lower density as well as the second section 21 of higher density. The second matrix 17 is disposed in a portion of the cooling channel 9 that is parallel to the first matrix 15.

The bottom cover 5 is further shown with a heat spreader block 14 and a substrate 24 that has integrated circuits 25 defining transistors thereon. These components in this example are part of the top cover (see FIG. 2) but are included here to show the relative location between the substrate 24, integrated circuits 25, and first and second matrices 15, 17. In other embodiments, the heat spreader block 14 may be formed as part of the bottom cover 5. Some of the integrated circuits 25 are adjacent to the pin fins of the first sections 19 while other of the integrated circuits 25 are adjacent to the pin fins of the second sections 21. Because the pin fins of the second sections 21 are more densely arranged, they may capture heat from the integrated circuits 25 adjacent thereto at faster rates than the pin fins of the first sections 19.

Figure 2:
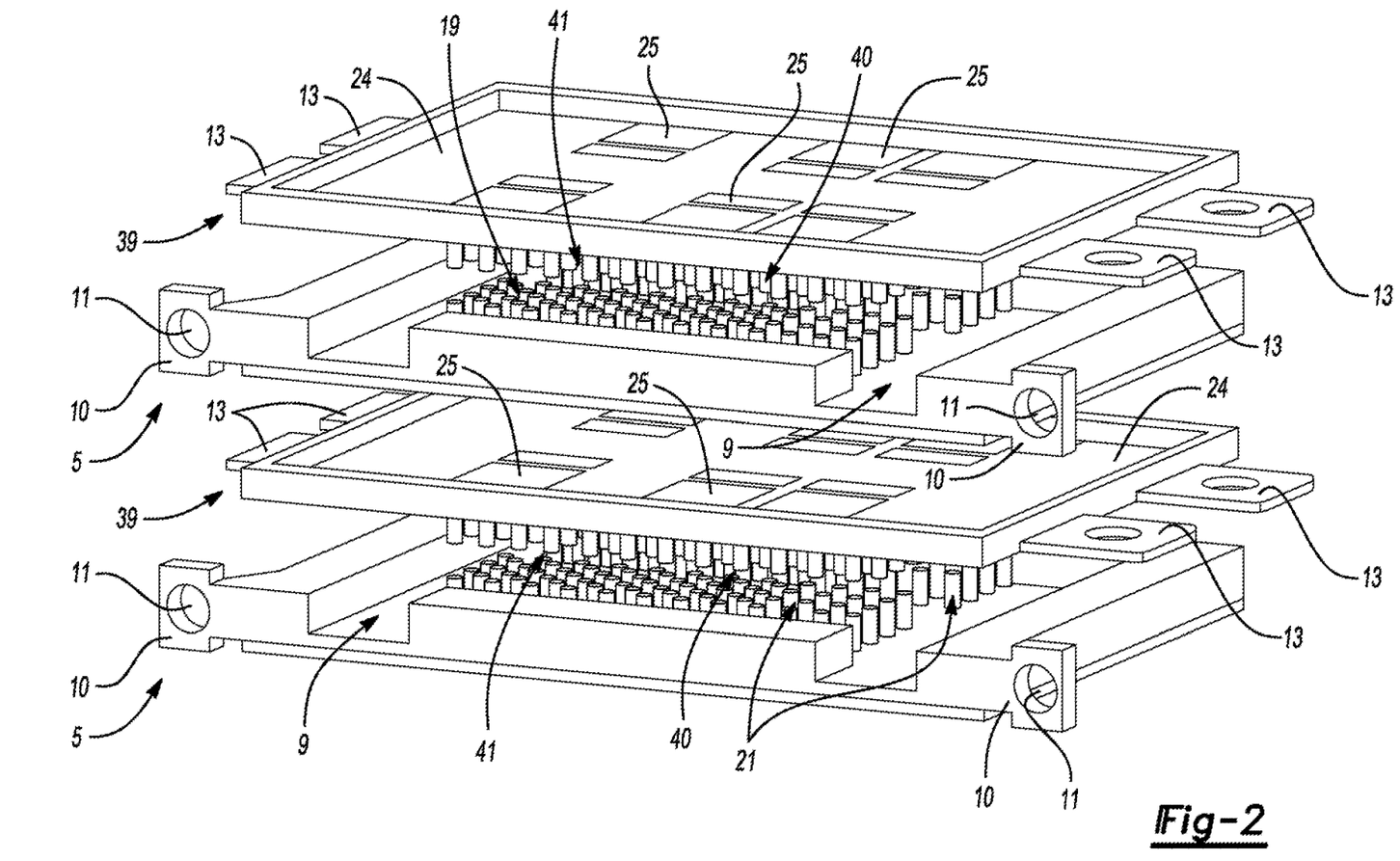
FIG. 2 is an exploded assembly view of several power cards.

FIG. 2 shows an embodiment capable of stacking. Depicted are top covers 39 alternating with the bottom covers 5. The top covers 39 each include terminals 13 extending from sides thereof, the substrate 24, and the integrated circuits 25. On a side opposite the substrate 24 and integrated circuits 25, each of the top covers 39 also define matrices of pins fins. Like the pin fin arrangements in the bottom cover 5, the matrices of the top cover are in sections 40, 41 of different densities: the arrangement of pin fins of the section 40 is denser than the arrangement of pin fins of the section 41. Thus, the pin fins of the section 40 occupy gaps between the pin fins of the section 19 when assembled. That is, the pin fins intermesh. Similarly, the pin fins of the section 41 occupy gaps between the pin fins of the section 21. The pin fins of the top covers 39, in other examples, may be arranged to have a uniform density that intermeshes with pin fins of the bottom cover 5. Each of the top covers 39 is mounted to and cooperates with a corresponding one of the bottom covers 5 to completely define the cooling channel 9.

In other examples, the sections of pins fins 19, 21, 40, 41 may be of different densities, patterns, or shapes. Further, the pins themselves may be composed of varying materials. The pins fins of the sections 19 may be made from a material, for example, that has a lower thermal conductive than the pin fins of the sections 21.

Figure 3:
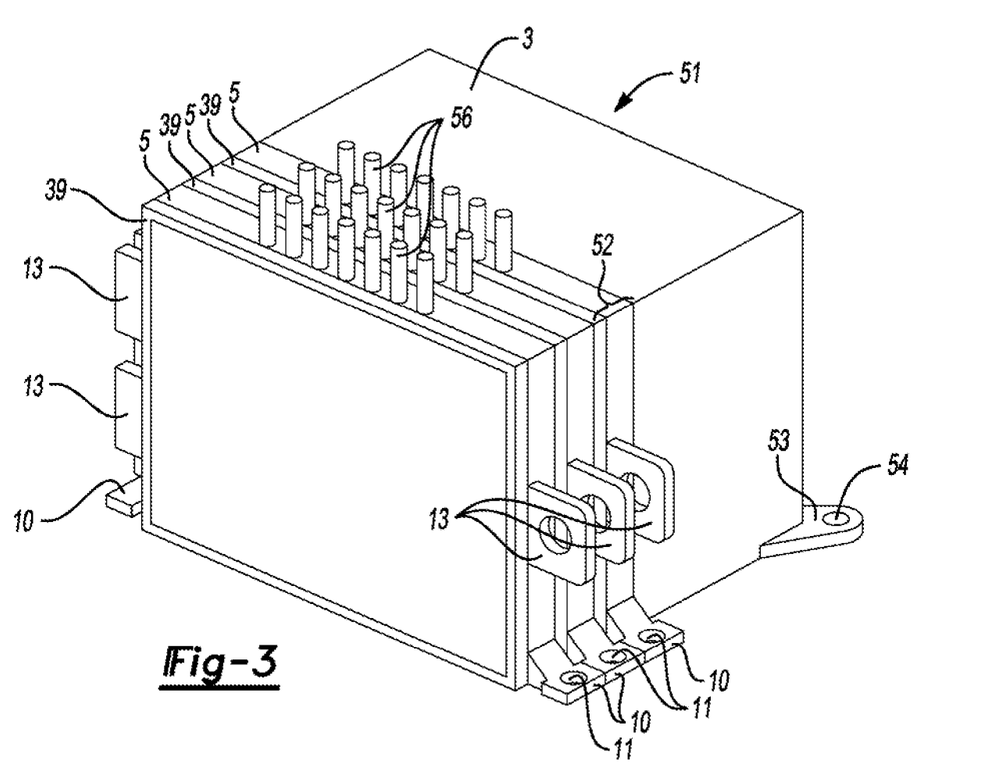
FIG. 3 is perspective view of a power inverter.

FIG. 3 shows an embodiment of a power inverter 51 containing a capacitor module 3 and three power cards 52. Each of the power cards 52 includes one of the top covers 39 and one of the bottom covers 5. The power cards 52 also each include signal pins 56 for communication with the integrated circuits. The power cards 52 are stacked and are in direct physical contact with each other. Further, the capacitor module 3 is also stacked and in direct physical contact with an end one of the power cards 52. Additionally, the capacitor module 3 also includes mounting legs 53 with through holes 54 for mounting to a substrate.

Figure 4:
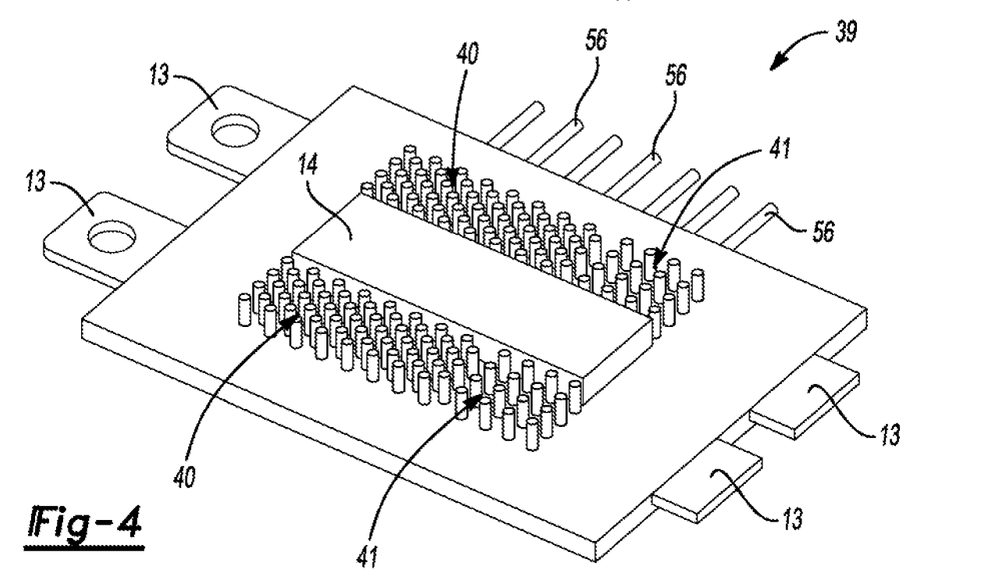
FIG. 4 is a perspective view of a top cover.
Figure 5A:
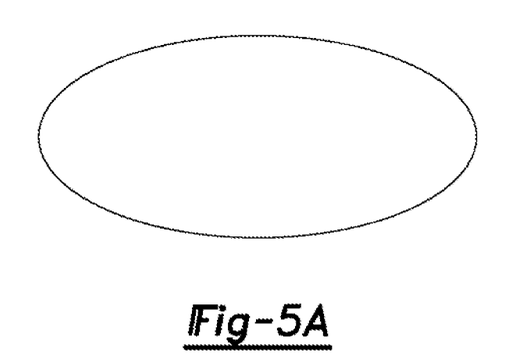
FIGS. 5A and 5B are plan views, in cross-section, of different pin fins.
Figure 5B:
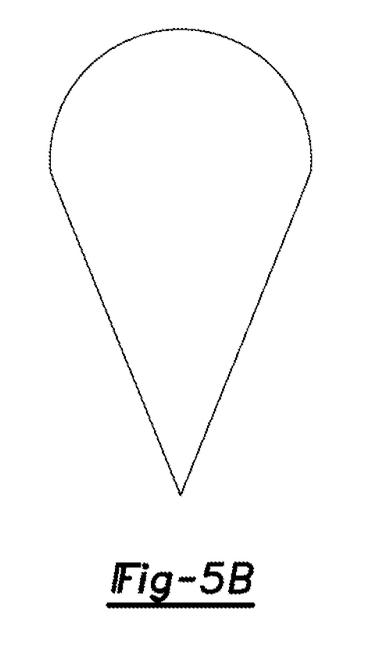

FIG. 4 shows a bottom side of the top cover 39. Here, the pins fins are shown with a circular cross-section. Other shapes are also possible. FIG. 5A shows an elliptical cross section for the pin fins. FIG. 5B shows a teardrop cross-section for the pin fins. Other shapes are also possible. In alternative embodiments, matrices may contain a combination of pin shapes.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An automotive power module comprising: a plurality of power cards stacked to form an inverter module; and a DC-link capacitor mounted against the inverter module, each of the power cards including, a baseplate having opposite sides, one of the sides having extended therefrom a first matrix of pins, some of the pins of the first matrix being composed of a first material having a first thermal conductivity, other of the pins of the first matrix being composed of a second material having a second thermal conductivity, and the first conductivity being greater than the second conductivity, a plurality of integrated circuits defining transistors of an inverter mounted on the other of the sides, some of the integrated circuits being configured to generate more heat than other of the integrated circuits during operation of the inverter, the some of the pins of the first matrix being directly opposite the some of the integrated circuits, the other of the pins of the first matrix being directly opposite the other of the integrated circuits, and the first matrix of pins being in thermal communication with the integrated circuits, terminals extending from a perimeter of the baseplate and in electrical communication with the integrated circuits, and a cover having extended therefrom a second matrix of pins, the cover configured to seal against the one of the sides of the baseplate such that the cover and baseplate define a cooling channel having an inlet and outlet, the first and second matrices intermesh, ends of the pins of the first matrix contact the cover, ends of the pins of the second matrix contact the baseplate to be in thermal communication with the integrated circuits, and coolant flowing through the channel flows through the first and second matrices to remove heat captured by the first and second matrices from the integrated circuits.

2. The power module of claim 1 further comprising a heat spreader block attached to the cover or the baseplate such that the heat spreader block further defines the channel.

3. The power module of claim 2, wherein the heat spreader block defines a first pathway and a second pathway in the channel.

4. The power module of claim 3, wherein the first pathway is substantially parallel to the second pathway.

5. The power module of claim 1, wherein a shape of a cross-section of the pins is circular.

6. The power module of claim 1, wherein a shape of a cross-section of the pins is elliptical.

7. The power module of claim 1, wherein a shape of a cross-section of the pins is teardrop.

8. An automotive power module comprising:
a plurality of power cards stacked to form an inverter module;
a DC-link capacitor mounted against the inverter module, each of the power cards including
a baseplate having opposite sides, one of the sides having extended therefrom a first matrix of pins arranged to have a first portion with a first density and a second portion with a second density, some of the pins of the first and second portions composed of a first material, and other of the pins of the first and second portions composed of a second material having a thermal conductivity different than the first material,
a plurality of integrated circuits defining transistors of an inverter mounted on the other of the sides, some of the integrated circuits being configured to generate more heat than other of the integrated circuits during operation of the inverter, and the first matrix being directly opposite and in thermal communication with the integrated circuits,
terminals extending from a perimeter of the baseplate and in electrical communication with the integrated circuits, and
a cover having opposite sides, one of the sides having extended therefrom a second matrix of pins, the cover configured to seal against the one of the sides of the baseplate such that the cover and baseplate define a cooling channel having an inlet and outlet, the first and second matrices intermesh, ends of the pins of the first matrix contact the cover, and ends of the pins of the second matrix contact the baseplate to be in thermal communication with the integrated circuits,
wherein coolant flowing through the channel flows through the first and second matrices to remove heat from the integrated circuits.

9. The power module of claim 8, wherein the first portion is disposed in the channel closer to the outlet than the second portion.

10. The power module of claim 8, wherein the second matrix of pins is arranged to have a third portion with a third density and a fourth portion with a fourth density, some of the pins of the third and fourth portions composed of a third material, and other of the pins of the third and fourth portions composed of a fourth material having a thermal conductivity different than the third material.

11. The power module of claim 10, wherein the first and third materials are same.

12. The power module of claim 10, wherein the second and fourth materials are same.

* * * * *